(12) United States Patent
Imer et al.

(10) Patent No.: US 7,361,576 B2
(45) Date of Patent: Apr. 22, 2008

(54) DEFECT REDUCTION OF NON-POLAR AND SEMI-POLAR III-NITRIDES WITH SIDEWALL LATERAL EPITAXIAL OVERGROWTH (SLEO)

(75) Inventors: Bilge M. Imer, Goleta, CA (US); James S. Speck, Goleta, CA (US); Steven P. DenBaars, Goleta, CA (US)

(73) Assignees: The Regents of the University of California, Oakland, CA (US); Japan Science and Technology Agency, Saitama (JP)

( * ) Notice: Subject to any disclaimer, the term of this patent is extended or adjusted under 35 U.S.C. 154(b) by 0 days.

(21) Appl. No.: 11/444,084

(22) Filed: May 31, 2006

(65) Prior Publication Data

US 2006/0270076 A1 Nov. 30, 2006

Related U.S. Application Data

(60) Provisional application No. 60/685,952, filed on May 31, 2005.

(51) Int. Cl.
*H01L 21/20* (2006.01)
*H01L 21/36* (2006.01)

(52) U.S. Cl. .................. 438/479; 438/41; 438/481; 257/E21.097; 257/E21.566

(58) Field of Classification Search ............ 438/481, 438/41, 479; 257/E21.566, E21.097
See application file for complete search history.

(56) References Cited

U.S. PATENT DOCUMENTS 5,543,353 A 8/1996 Suzuki et al.

(Continued)

FOREIGN PATENT DOCUMENTS

EP 0942459 9/1999

(Continued)

OTHER PUBLICATIONS

Baker, T.J. et al., "Characterization of Planar Semipolar Gallium Nitride Films on Spinel Substrates," Japanese Journal of Applied Physics, 2005, vol. 44(29).

(Continued)

*Primary Examiner*—Walter Lindsay, Jr.
*Assistant Examiner*—Abdulfattah Mustapha
(74) *Attorney, Agent, or Firm*—Gates & Cooper LLP

(57) ABSTRACT

A method of reducing threading dislocation densities in non-polar such as a-{11-20} plane and m-{1-100} plane or semi-polar such as {10-1n} plane III-Nitrides by employing lateral epitaxial overgrowth from sidewalls of etched template material through a patterned mask. The method includes depositing a patterned mask on a template material such as a non-polar or semi polar GaN template, etching the template material down to various depths through openings in the mask, and growing non-polar or semi-polar III-Nitride by coalescing laterally from the tops of the sidewalls before the vertically growing material from the trench bottoms reaches the tops of the sidewalls. The coalesced features grow through the openings of the mask, and grow laterally over the dielectric mask until a fully coalesced continuous film is achieved.

18 Claims, 6 Drawing Sheets

U.S. PATENT DOCUMENTS

| | | | |
|---|---|---|---|
| 6,051,849 | A | 4/2000 | Davis et al. |
| 6,121,121 | A | 9/2000 | Koide |
| 6,153,010 | A | 11/2000 | Kiyoku et al. |
| 6,177,292 | B1 | 1/2001 | Hong et al. |
| 6,177,688 | B1 | 1/2001 | Linthicum et al. |
| 6,180,270 | B1 | 1/2001 | Cole et al. |
| 6,255,198 | B1 | 7/2001 | Linthicum et al. |
| 6,261,929 | B1 | 7/2001 | Gehrke et al. |
| 6,265,289 | B1 | 7/2001 | Zheleva et al. |
| 6,268,621 | B1 | 7/2001 | Emmi et al. |
| 6,271,104 | B1 | 8/2001 | Razeghi et al. |
| 6,350,666 | B2 | 2/2002 | Kryliouk |
| 6,413,627 | B1 | 7/2002 | Motoki et al. |
| 6,468,882 | B2 | 10/2002 | Motoki et al. |
| 6,582,986 | B2 | 6/2003 | Kong et al. |
| 6,586,316 | B2 | 7/2003 | Tsuda et al. |
| 6,599,362 | B2 | 7/2003 | Ashby et al. |
| 6,602,763 | B2 | 8/2003 | Davis et al. |
| 6,610,144 | B2 | 8/2003 | Mishra |
| 6,623,560 | B2 | 9/2003 | Biwa et al. |
| 6,635,901 | B2 | 10/2003 | Sawaki et al. |
| 6,645,295 | B1 | 11/2003 | Koike et al. |
| 6,847,057 | B1 | 1/2005 | Gardner et al. |
| 6,900,070 | B2 * | 5/2005 | Craven et al. ............. 438/41 |
| 7,208,393 | B2 | 4/2007 | Haskell et al. |
| 7,220,658 | B2 | 5/2007 | Haskell et al. |
| 2001/0029086 | A1 | 10/2001 | Ogawa et al. |
| 2002/0098641 | A1 | 7/2002 | Tsuda et al. |
| 2002/0111044 | A1 | 8/2002 | Linthicum et al. |
| 2003/0114017 | A1 | 6/2003 | Wong et al. |
| 2004/0108513 | A1 | 6/2004 | Narukawa et al. |
| 2004/0251471 | A1 | 12/2004 | Dwilinski et al. |
| 2004/0261692 | A1 | 12/2004 | Dwilinski et al. |
| 2005/0205584 | A1 | 9/2005 | Kim et al. |
| 2006/0128124 | A1 * | 6/2006 | Haskell et al. ............. 438/483 |
| 2006/0138431 | A1 | 6/2006 | Dwilinski et al. |
| 2007/0015345 | A1 | 1/2007 | Baker et al. |

FOREIGN PATENT DOCUMENTS

| | | |
|---|---|---|
| EP | 0951055 | 10/1999 |
| JP | 10312971 | 11/1998 |
| JP | 2001257166 | 9/2001 |
| WO | 99/65068 | 12/1999 |
| WO | 00/31783 | 6/2000 |
| WO | 00/33365 | 6/2000 |
| WO | 01/27980 | 4/2001 |
| WO | 01/37327 | 5/2001 |
| WO | 01/43174 | 6/2001 |
| WO | 01/47002 | 6/2001 |
| WO | 01/59819 | 8/2001 |
| WO | 01/63654 | 8/2001 |
| WO | 04/061909 | 7/2004 |
| WO | 04/061969 | 7/2004 |

OTHER PUBLICATIONS

Bottcher, T., et al., "The role of high-temperature island coalescence in the development of stresses in GaN films" Appl. Phys. Lett. Apr. 2, 2001, 78 (14), pp. 1976-1978.

Chakraborty et al., "Nonpolar InGaN/GaN emmitters on reduced-defect lateral epitaxially overgrown a-plane GaN with drive-current-independent electroluminescence emission peak," Applied Physics Letters Nov. 29, 2004, vol. 85(22).

Chakraborty et al., "Defect reduction in nonpolar *a*-plane GaN films using *in situ* SIN$_x$ nanomask," Applied Physics Letters 89, (2006), 3 pages.

Chakraborty et al., "Demonstration of nonpolar *m*-plane InGaN/GaN light-emitting diodes on free-standing *m*-plane GaN substrates," Japanese Journal of Applied Physics vol. 44, No. 5, 2005, pp. L173-175.

Chen, C., et al., "A new selective area lateral epitaxy approach for depositing a-plane GaN over r-plane sapphire," Jpn. J. Appl. Phys. 2003, vol. 42, pp. L818-820.

Chen, Y. et al., "Dislocation reduction in GaN thin films via laternal overgrowth from trenches," Appl. Phys. Letters. 1999, 75(14), p. 2062.

Craven, M.D. et al., "Characterization of a-Plane GaN/(Al,Ga)N Multiple Quantum Wells Grown via Metrlorganic Chemical Vapor Deposition" Jpn. J. Appl. Phys. 2003, vol. 42, pp. I.235-I.238.

Craven, M.D. et al., "Structural characterization of nonpolar (1120) *a*-plane GaN thin films grown on (1102) *r*-plane sapphire," Jul. 2002, Applied Physics Letters, 81(3):469-471.

Craven, M.D., et al., "Threading dislocation reduction via laterally overgrown nonpolar (1120) a-plane GaN" appl. Phys. Lett. Aug. 12, 2002, 81 (7), pp. 1201-1203.

Davis, R.D. et al., MRS Internet Journal Nitride Research 2001, 6, p. 14.

Dupuis, R.D. et al., "Selective-area and lateral epitaxial overgrowth of III-N materials by metalorganic chemical vapor deposition," Journal of Crystal Growth, Dec. 15, 1998, vol. 195, No. 1-4, pp. 340-345, XP004154285.

Fini, P. "Threading Dislocation Reduction in Gallium Nitride thin Films on Sapphire Via Lateral Epitaxial Overgrowth," PhD Thesis, University of California, Department of Engineering 2000, p. 61.

Freitas, J. A. Jr., et al., "Optical characterization of lateral epitaxial overgrown GaN layers" Appl. Phys. 8 Jun. 1998, Lett. 72 (23), pp. 2990-2992.

Gehrke, T. et al., "Pendeo-Epitaxy of Gallium Nitride and Aluminum Nitride Films and Heterostructure on Silicon Carbide Substrate," MRS Internet J. Semicond. Res. 1999, 4S1, G3.2, 6 pages.

Haskell et al., "Defect reduction in (1120) a-plane gallium nitride via lateral epitaxial overgrowth by hydride vapor-phase epitaxy," Applied Physics Letters Jul. 28, 2003, vol. 83(4), p. 644.

Haskell et al., "Defect reduction in (1 i00) a-plane gallium nitride via lateral epitaxial overgrowth by hydride vapor-phase epitaxy," Applied Physics Letters, 2005, vol. 86, 111917.

Heying, B., et al., "Role of threading dislocation structure on the x-ray diffraction peak widths in epitaxial GaN films" Appl. Phys. Lett. 29 Jan. 1996, 68 (5), pp. 643-645.

Jin, S.X. et al., "GaN microdisk light emitting diodes," Appl. Phys. Lett. 2000, vol. 76(5), pp. 631-633.

Kaplonek, D., et al., "Anisotropic epitaxial lateral growth in GaN selective area epitaxy" Appl. Phys. Lett. Sep. 1, 1997, 71 (9), pp. 1204-1206.

Katona, T.M. et al., "Effect of the nucleation layer on stress during cantilever epitaxy of GaN on Si (111)," Physical Status Solidi A, 2002, vol. 194, pp. 541-544.

Kozodoy, P. et al., "Electrical Characterization of GaN *p-n* Junctions With and Without Threading Dislocations," Appl. Phys. Lett., 1998, 73(7):975-977.

Linthicum, K. et al., "Pendeoepitaxy of gallium nitride films," Appl. Phys. Lett., 75(2) 196 (1999).

Liu, L. et al., "Substrates for gallium nitride epitaxy," Materials Science and Engineering R, Reports: A Review Journal, Apr. 30, 2002, vol. 37(3), pp. 61-127, XP004349792.

Marchand, H., et al., "Mechanisms of lateral epitaxial overgrowth of gallium nitride by metalorganic chemical vapor deposition," Journal of Crystal Growth, Dec. 15, 1998, vol. 195(1-4), pp. 328-3332, XP004154283.

Marchand, H., et al., "Microstructure of GaN laterally overgrown by metalorganic chemical vapor deposition" Appl. Phys. Lett. Aug. 10, 1998, 73 (6), pp. 747-749.

Marchand, H., et al., "Atomic force microscopy observation of threading dislocation density reduction in lateral epitaxial overgrowth of gallium nitride by MOCVD" MRS Internet J. Nitride Semicond. Res. 1998, 3,3, pp. 1-7.

Mills, Alan, "Wide-bandgap emitters continue to improve," III-Vs Review, May 2000, vol. 13(3), May 2000, pp. 23-24, 26, 28-30, XP004200697.

Moustakas, T.D., et al., "Growth of GaN by ECR-assisted MBE" Physica B 185, 1993, pp. 36-49.

Motoki, J., et al., "Preparation of Large Freestanding GaN Substrates by Hydride Vapor Phase Epitaxy Using GaAs as a Starting Substrate" Jpn. J. Appl. Phys. 2001, vol. 40(2), pp. L140-L143.

Mukai et al., "Ultraviolet InGaN and GaN Single-Quatum-Well-Structure Light-Emitting Diodes Grown on Epitaxially Laterally Overgrown GaN Substrates," Jpn. J. Appl. Phys., 1999, vol. 38, pp. 5735-5739.

Nakamura, S. et al., The Blue Laser Diode, (Springer, Heidelberg, 1997), p. 328.

Nakamura, S. et al., "InGaN/GaN/AlGaN-Based Laser Diodes with Modulation-Doped Strained-Layer Superlattices Grown on an Epitaxially Laterally Overgrown GaN Substrate," Appl. Phys. Lett., 1998, 72(2):211-213.

Nakamura, S. et al., "Violet InGaN/GaN/AlGaN-Based Laser Diodes Operable at 50°C with a Fundamental Transverse Mode" Jpn. J. Appl. Phys. 1999, 38(2), pp. L226-L229.

Nam, O., et al., "Lateral epitaxy of low defect density GaN layers via organometallic vapor phase epitaxy" Appl. Phys. Lett. Nov. 3, 1997, 71(18), pp. 2638-2640.

Nataf, G., et al., "Lateral overgrowth of high quality GaN layers on GaN/Al$_2$O$_3$ patterned substrates by halide vapour-phase epitaxy" J. of Crystal Growth (192), Feb. 20, 1998, pp. 73-78.

Ng, H. M., "Molecular-beam epitaxy of GaN/Al$_x$Ga$_{1-x}$N multiple quantum wells on R-plane (1012) sapphire substrates" Appl. Phys. Lett. Jun. 10, 2002, 80(23), pp. 4369-4371.

Nishizuka, K., "Efficient radiative Recombination From <112>-oriented InxGa1-xN Multiple Quantum Wells Fabricated by the Regrowth Technique," Applied Physics Letters, Oct. 2004, vol. 85(15), pp. 3122-3124, abstract.

Nishizuka, K. et al., "Efficient Rainbow color Luminescene... microfacets" Applied Physics Letters, 2005, vol. 87(23), p.231901.

Okamoto, K. et al., "Dislocation-Free m-Plane inGaN/GaN Light-Emitting Diodes on m-Plane GaN Single Crystals," Jpn. J. Appl. Phys. 2006, vol. 45(45), pp. L1197-L1199.

Parish, G. et al., "High-Performance (Al,Ga) N-Based Solar-Blind Ultraviolet p-i-n Detectors on Laterally Epitaxially Overgrown GaN," Appl. Phys. Lett., 1999, 75(2):247-249.

Park, J., et al., "Selective-area and lateral epitaxial overgrowth of III-N materials by metal organic chemical vapor deposition" Appl. Phys. Lett. Jul. 20, 1998, 73 (3), pp. 333-335.

Parilliaud, O., et al., "Localized Epitaxy of GaN by HVPE on patterned Substrates" MRS Internet J. Nitride Semicond. Res. Oct. 19, 1998, 3(40), pp. 1-9.

Paskov, T., et al., "Defect Reduction in HVPE Growth of GaN and related Optical Spectra" Phys. Stat. Sol. (a) 2001, 183, pp. 197-203.

Romanov, A. et al., "Modelling the extended defect evolution in lateral epitaxial overgrowth of GaN: subgrain stability," Journal of Applied Physics, 2003, vol. 93(2).

Rosner, S.J., et al., "Cathodoluminescence mapping of epitaxial lateral overgrowth in gallium nitiride" Appl. Phys. Lett. Apr. 5, 1999, 74(14), pp. 2035-2037.

Sakai, A., et al., "self-Organized propagation of dislocations in GaN films during epitaxail lateral growth" Appl. Phys. Lett. Jan. 24, 2000, 76(4), pp. 442-444.

Sakai, S. et al., "A new method of reducing dislocation density in GaN layer grown on sapphire substrate by MOVPE," J. Cryst. Growth, 2000, 221, pp. 334-337.

Sharma, R. et al., "Demonstration of semipolar (1013) InGaN/GaN green light emitting diode," Applied Physics Letters, 2005, vol. 87, pp. 231110-1-231110-3.

Sumiyoshi, K. et al., "Al$_{0.17}$Ga$_{0.83}$N Film Using Middle-Temperature Intermediate Layer Grown on (0001) Sapphire Substrate by Metal Organic Chemical Vapor Deposition," Jap. J. Appl. Phys., 2007, 46(2), pp. 491-495 (http://jjap.ipap.jp/link?JJAP/46/491/).

Sun, Chien-Jen, et al., "Comparison of the physical properties of GaN thin films deposited on (0001) and (0112) sapphire substrates", Appl. Phys. Lett., 1993, vol. 63(7), pp. 973-975.

Tanaka, S. et al., "Anti-Surfacant in III-Nitride-Epitaxy—Quantum Dot Formation and Dislocation Termination," Jpn. J. Appl. Phys., 2000, 39: L831-L834.

Tojyo et al., "GaN-based high power blue-violet laser diodes," Jpn. J. Appl. Phys., 2001, vol. 40, pp. 3206-3210.

Usui, A. et al., "Thick GaN Epitaxial Growth with Low Dislocation Density by Hydride Vapor Phase Epitaxy," Jpn. J. Appl. Phys., 1997, 36:L899-L902.

Wang, F. et al., "Crystal Tilting in the Epitaxial Laterally Overgrown GaN Films on Sapphire Substrate by Hydride Vapor Phase Epitaxy", Solid State and Integrated-Circuit Technology Proceedings, 6$^{th}$ International Conference, Oct. 2001, vol. 2, pp. 1998-1201.

Wu, F. et al., "Polarity determination of a-plane GaN on r-plane sapphire and its effects on lateral overgrowth and heteroepitaxy," J. Appl. Phys. 2003, vol. 94(2), pp. 942-947.

Yu., Z., et al., "Epitaxial lateral overgrowth of GaN on SiC and sapphire substrates" MRS Internet J. Nitride Semicond. Res. 4S1, G4.3 (1999).

Yun, F. et al., "Efficacy of single and double SiN$_x$ interlayers on defect reduction in GaN overlayers grown by organometallic vapor-phase epitaxy," J. Appl. Phys. 2005, vol. 98, pp. 123502-1-123502-8.

Zheleva, T., et al., "Dislocation density reduction via lateral epitaxy in selectively grown GaN structures" Appl. Phys. Lett. Oct. 27, 1997, 71(17), pp. 2472-2474.

Zheleva, T., et al., "Pendo-epitaxy- A new approach for lateral growth of gallium nitride structures" MRS Internat J. Nitride Semicond. Res. 4S1, G3.38 (1999).

* cited by examiner

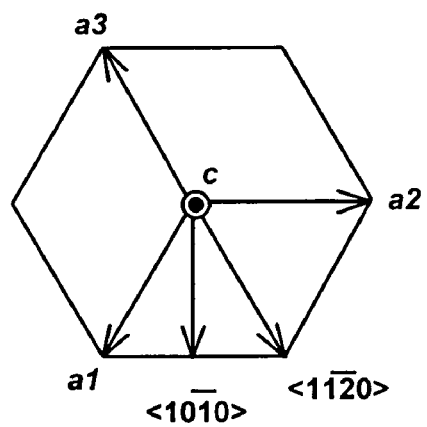 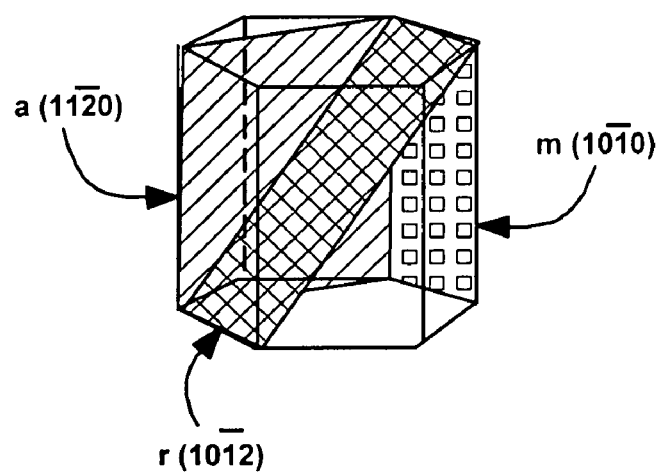
*FIG. 1(a)*  *FIG. 1(b)*

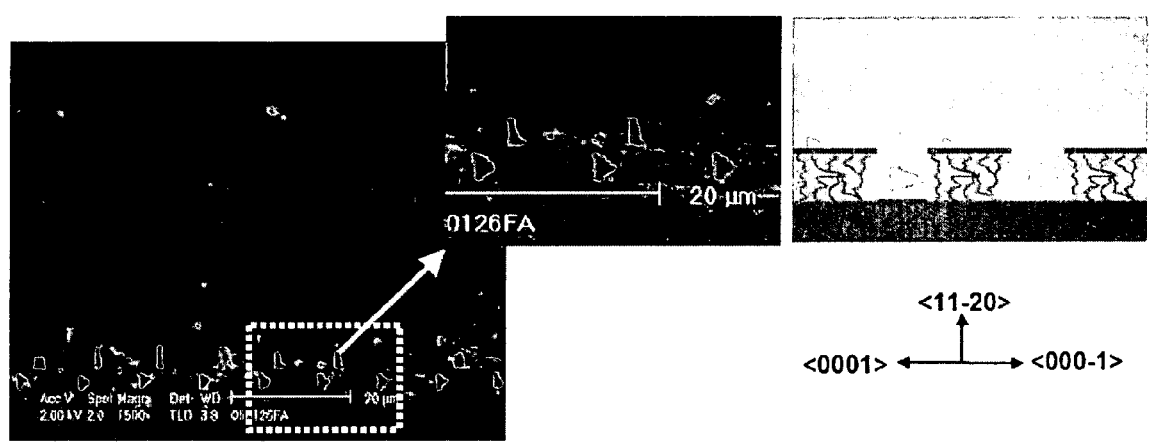
*FIG. 5(a)*  *FIG. 5(b)*

DEFECT REDUCTION OF NON-POLAR AND SEMI-POLAR III-NITRIDES WITH SIDEWALL LATERAL EPITAXIAL OVERGROWTH (SLEO)

CROSS-REFERENCE TO RELATED APPLICATIONS

This application claims the benefit under 35 U.S.C. Section 119(e) of the following co-pending and commonly-assigned U.S. patent application:

U.S. Provisional Patent Application Ser. No. 60/685,952, filed on May 31, 2005, by Bilge M. Imer, James S. Speck and Steven P. Denbaars, entitled "DEFECT REDUCTION OF NON-POLAR GALLIUM NITRIDE WITH SINGLE-STEP SIDEWALL LATERAL EPITAXIAL OVERGROWTH";

which application is incorporated by reference herein.

This application is related to the following co-pending and commonly-assigned applications:

U.S. patent application Ser. No. 11/444,083, filed on May 31, 2006, by Bilge M. Imer, James S. Speck and Steven P. DenBaars, entitled "GROWTH OF PLANAR NON-POLAR {1-100} M-PLANE GALLIUM NITRIDE WITH METALORGANIC CHEMICAL VAPOR DEPOSITION (MOCVD)," (2005-566), which application claims the benefit under 35 U.S.C. Section 119(e) of U.S. Provisional Patent Application Ser. No. 60/685,908, filed on May 31, 2005 by Bilge M. Imer, James S. Speck and Steven P. DenBaars, entitled "GROWTH OF PLANAR NON-POLAR {1-100} M-PLANE GALLIUM NITRIDE WITH METALORGANIC CHEMICAL VAPOR DEPOSITION (MOCVD)";

which applications are incorporated by reference herein.

BACKGROUND OF THE INVENTION

1. Field of the Invention

The present invention relates to defect reduction of non-polar and semi-polar III-Nitrides with sidewall lateral epitaxial overgrowth (SLEO).

2. Description of the Related Art

Gallium nitride (GaN) and its ternary and quaternary compounds are prime candidates for fabrication of visible and ultraviolet high-power and high-performance optoelectronic devices and electronic devices. These devices are typically grown epitaxially as thin films by growth techniques including molecular beam epitaxy (MBE), metalorganic chemical vapor deposition (MOCVD), or hydride vapor phase epitaxy (HVPE). The selection of substrates is critical for determining the III-Nitride growth direction. Some of the most widely used substrates for nitride growth include SiC, $Al_2O_3$, and $LiAlO_2$. Various crystallographic orientations of these substrates are commercially available which cause a-plane, m-plane, or c-plane growth of GaN.

FIGS. 1(a) and 1(b) are schematics of crystallographic directions and planes of interest in hexagonal GaN. Specifically, these schematics show the different crystallographic growth directions and also the planes of interest in the hexagonal wurtzite GaN structure, wherein FIG. 1(a) shows the crystallographic directions a1, a2, a3, c, <10-10> and <11-20>, and FIG. 1(b) shows planes a (11-20), m (10-10) and r (10-12). The fill patterns of FIG. 1(b) are intended to illustrate the planes of interest, but do not represent the materials of the structure.

It is relatively easy to grow c-plane GaN due to its large growth window (pressure, temperature and precursor flows) and its stability. Therefore, nearly all GaN-based devices are grown along the polar c-axis. However, as a result of c-plane growth, each material layer suffers from separation of electrons and holes to opposite faces of the layers. Furthermore, strain at the interfaces between adjacent layers gives rise to piezoelectric polarization, causing further charge separation. FIGS. 2(a) and 2(b), which are schematics of band bending and electron hole separation as a result of polarization, show this effect, wherein FIG. 2(a) is a graph of energy (eV) vs. depth (nm) and represents a c-plane quantum well, while FIG. 2(b) is a graph of energy (eV) vs. depth (nm) and represents a non-polar quantum well.

Such polarization effects decrease the likelihood of electrons and holes recombining, causing the device to perform poorly. One possible approach for eliminating piezoelectric polarization effects in GaN optoelectronic devices is to grow the devices on non-polar planes such as a-{11-20} and m-{1-100} plane. Such planes contain equal numbers of Ga and N atoms and are charge-neutral.

Another reason why GaN materials perform poorly is the presence of defects due to lack of a lattice matched substrate. Bulk crystals of GaN are not widely available so it is not possible to simply cut a crystal to present a surface for subsequent device regrowth. All GaN films are initially grown heteroepitaxially, i.e., on foreign substrates that have a lattice mismatch to GaN.

There is an ever-increasing effort to reduce the dislocation density in GaN films in order to improve device performance. The two predominant types of extended defects of concern are threading dislocations and stacking faults. The primary means of achieving reduced dislocation and stacking fault densities in polar c-plane GaN films is the use of a variety of lateral overgrowth techniques, including single step and double step lateral epitaxial overgrowth (LEO, ELO, or ELOG), selective area epitaxy, cantilever and pendeo-epitaxy. The essence of these processes is to block (by means of a mask) or discourage dislocations from propagating perpendicular to the film surface by favoring lateral growth over vertical growth. These dislocation-reduction techniques have been extensively developed for c-plane GaN growth by HVPE and MOCVD.

The present invention is the first-ever successful execution of sidewall lateral epitaxial overgrowth (SLEO) of non-polar a-plane and m-plane GaN by any growth technique. Prior to the invention described herein, SLEO of a-plane and/or m-plane GaN had not been demonstrated.

SUMMARY OF THE INVENTION

The general purpose of the present invention is to create high quality (minimum defect density) non-polar a-{11-20} and m-{1-100} plane and semi-polar {10-1n} plane III-Nitride material by employing lateral overgrowth from sidewalls of etched nitride material through a dielectric mask. The method includes depositing a patterned mask on non-polar or semi-polar III-Nitride template, etching the template material down to various depths through openings in the mask, and regrowing the non-polar or semi-polar epitaxial film by coalescing laterally from the tops of the sidewalls before the vertically growing material from the trench bottoms reaches the surface. The coalesced features grow through the openings of the mask, and grow laterally over the dielectric mask until a fully coalesced continuous film is achieved.

These planar non-polar materials grown heteroepitaxially, such as a-GaN on top of $r-Al_2O_3$, contain dislocation densities of $\sim 10^{10}$ cm$^{-2}$ and stacking fault densities of $3.8 \times 10^5$ cm$^{-1}$ (aligned perpendicular to the c-axis) throughout the film. By using single step lateral epitaxial overgrowth, dislocation densities can be reduced down to ~10$^7$-10$^9$ cm$^{-2}$ and stacking faults are localized only on the nitrogen faces. With the present invention, using sidewall lateral epitaxial overgrowth, dislocation densities can be reduced down to even lower values by eliminating defects not only in the overgrown regions but also in the window regions. Also, by favoring gallium (Ga) face growth and limiting nitrogen (N) face growth stacking fault densities can be made orders of magnitude lower.

The present invention also takes advantage of the orientation of non-polar III-Nitrides to eliminate polarization fields. As a result, with the material produced by utilizing this invention, device improvements such as longer lifetimes, less leakage current, more efficient doping and higher output efficiency will be possible. In addition, a thick non-polar and semi-polar nitride free-standing substrate, which is needed to solve the lattice mismatch issue, can be produced over this excellent material by various methods.

BRIEF DESCRIPTION OF THE DRAWINGS

Referring now to the drawings in which like reference numbers represent corresponding parts throughout:

FIGS. 1(a) and 1(b) are schematics of crystallographic directions and planes of interest in hexagonal GaN.

FIG. 5(a) is a scanning electron microscopy image of a coalesced SLEO material and FIG. 5(b) is a schematic that further illustrates the coalesced SLEO material.

DETAILED DESCRIPTION OF THE INVENTION

Figure 2A:
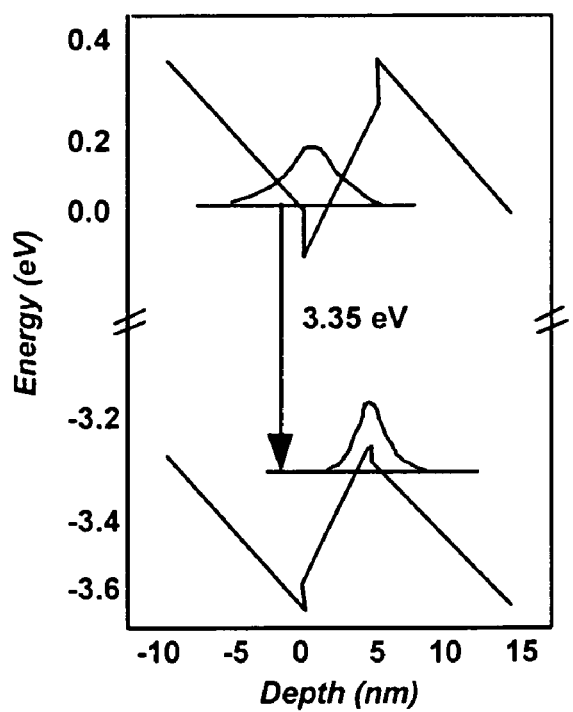
FIGS. 2(a) and 2(b) are schematics of band bending and electron hole separation as a result of polarization.
Figure 2B:
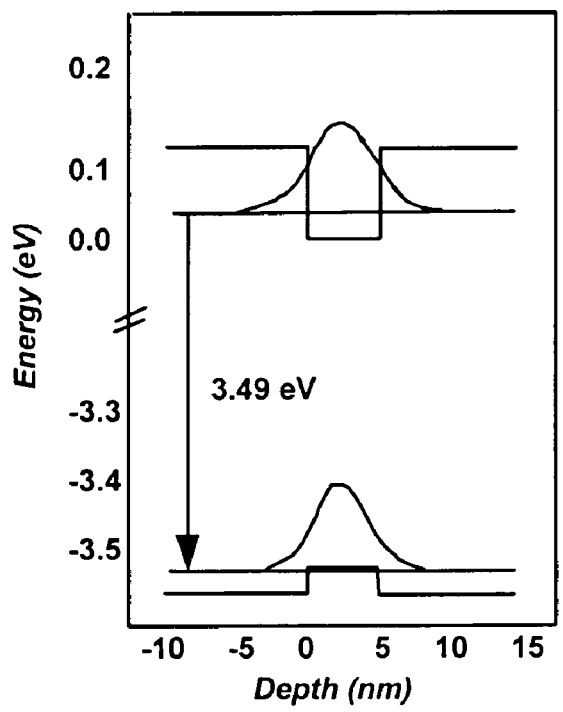

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

The growth of (Ga, In, Al, B)N materials in the polar [0001] c-direction causes lower performance in optical devices due to polarization fields causing charge separation along the primary conduction direction. Therefore, research has recently been conducted on non-polar direction growth along the a-[11-20] and m-[1-100] directions of these materials to eliminate such effects and improve device performance significantly.

Another problem that is common to polar, semi-polar and non-polar III-Nitride materials is high defect densities, the most common of which are dislocations and stacking faults. Dislocations arise as a result of lattice mismatch in heteroepitaxial growth due to a lack of proper III-Nitride substrates, and stacking faults form because of disorder of atomic stacking during growth, which is, for example, predominant on the nitrogen face sidewall during a-plane GaN growth. With the present invention, the presence of these stacking faults can be minimized by favoring Ga face growth and limiting N face growth.

Dislocation densities in directly grown (Ga, In, Al, B)N materials are quite high. High-performance devices could be achieved by reducing or ideally eliminating these defects accompanied by the use of non-polar materials. Such defects have been reduced by various methods involving LEO in polar and non-polar GaN over the years. The essence of these processes is to block or discourage dislocations from propagating perpendicular to the film surface by favoring lateral growth over vertical growth. Any LEO method involves blocking of defective material with the use of a mask deposited on the surface. Single-step LEO involves only one mask patterning and regrowth step, so it is simple to process and grow, but the results are not as effective as double-step LEO at defect reduction. Although double LEO is effective in defect reduction, it takes twice the amount of processing and growth efforts as compared to single step LEO, as the name implies. As a result, none of these methods have been both convenient and effective enough at the same time until now. With the use of SLEO in the present invention, it is possible to eliminate these defects in non-polar or semi-polar nitrides as effectively as double-step LEO by using as simple processing and growth methods as single-step LEO does. This invention nucleates on and grows from the tops of etched pillar sidewalls of non-polar or semi-polar nitride material, and coalesces the tops of the adjacent pillar sidewalls before the defective material from the heteroepitaxial interface (at the bottom of the trenches) reaches the top.

The present invention improves the materials' device performance in two ways: (1) by utilizing the natural structural advantage of non-polar material, a-{11-20} and m-{1-100} plane or semi-polar {10-1n}plane III-Nitride materials, to eliminate or reduce polarization effects, and (2) by eliminating defects effectively while employing a unique, reproducible, simple, and efficient process and growth method.

Technical Description

The present invention reduces threading dislocation densities in non-polar and semi-polar nitrides by employing LEO from sidewalls of etched nitride material through a dielectric mask. As described earlier, stacking faults reside on the N face, one of the vertically oriented faces. This invention also decreases stacking fault densities with an anisotropy factor, i.e., by encouraging higher growth rates on the Ga-(0001) face and limiting the N-(000-1) face growth rates. By utilizing various growth conditions and processing methods, the present invention has demonstrated lateral growth and coalescence of non-polar GaN from sidewalls, and up and over the dielectric mask.

Figure 3:
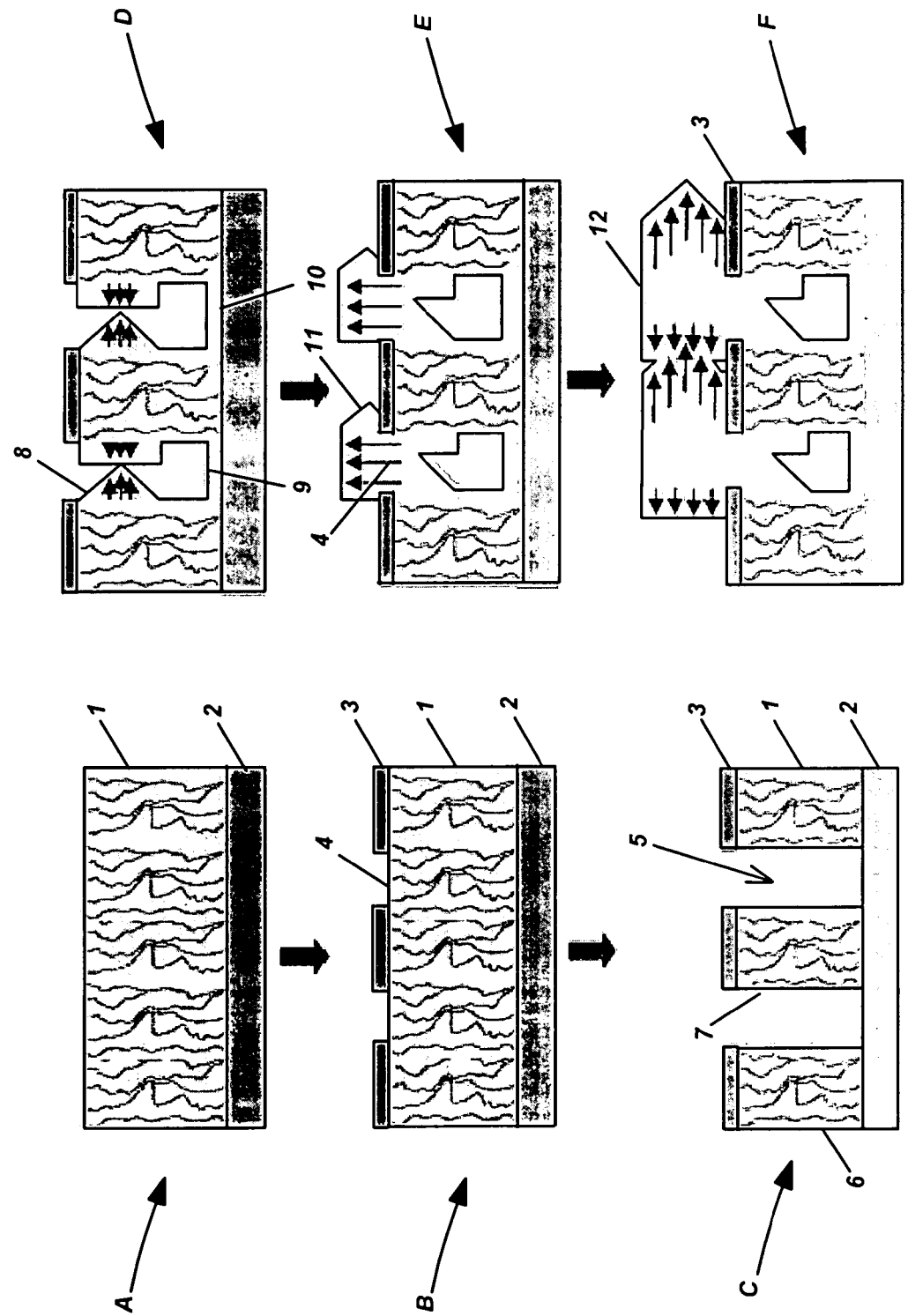
FIG. 3 is a flowchart, including associated schematics, that illustrates the three SLEO processing steps and the three stages of regrowth.

FIG. 3 is a flowchart, including associated schematics, that illustrates a method of reducing threading dislocation densities in non-polar or semi-polar III-Nitride material, employing LEO of non-polar or semi-polar III-Nitride material from sidewalls of etched template material through a patterned mask.

In this embodiment, the method comprises three SLEO processing steps labeled as A, B and C, and three stages of growth or regrowth labeled as D, E and F.

Step A—A template material (1) is formed on an appropriate substrate (2). The template material (1) may comprise a non-polar or semi-polar nitride epitaxial film, such as {11-20} or {1-100} or {10-1n} plane GaN, deposited on the appropriate substrate Step B—A patterned mask (3) is formed on the template material (1). The patterned mask (3) may be a dielectric mask and may be deposited on the template material (1) by one of a variety of means. The patterned mask (3) may comprise one or more openings (4), wherein the openings (4) comprise apertures or stripes allowing access to the underlying template material (1).

Step C—The template material (1) is etched through the openings (4) in the patterned mask (3) to form one or more trenches (5) or pillars (6) in the template material (1), wherein the trenches (5) or pillars define sidewalls (7). The orientation of the openings (4) is aligned in a way that creates planar sidewalls (7) in subsequent lateral growth steps when the template material (1) is etched through the openings (4) in the patterned mask (3).

Following Step C, the template material (1) is loaded into a reactor for the growth stages.

Step D—A first growth stage "SIDE" is performed, wherein non-polar or semi-polar III-Nitride material, which may comprise {11-20} or {1-100} or {10-1n} plane GaN grown, first by growing and coalescing the non-polar or semi-polar III-Nitride material laterally from the tops (8) of the sidewalls (7) (as indicated by the arrows), before the non-polar or semi-polar III-Nitride material vertically growing from the bottoms (9) of the trenches (5) reaches the tops (8) of the sidewalls (7). Preferably, the non-polar or semi-polar III-Nitride material grows only from the regions of exposed template material (1), but not on the patterned mask (3). Specifically, the non-polar or semi-polar III-Nitride material nucleates on and grows from both the tops (8) of the sidewalls (7) and the bottoms (9) of the trenches (5). The non-polar or semi-polar III-Nitride material vertically growing from the bottoms (9) of the trenches (5) may comprise defective material from a heteroepitaxial interface (10). Coalescing the non-polar or semi-polar III-Nitride material growing laterally from the tops (8) of the sidewalls (7) may block the defected material vertically growing from the bottoms (9) of the trenches (5).

Step E—A second growth stage "UP" is performed, wherein the non-polar or semi-polar III-Nitride material (11) grows vertically up through the openings (4) (as indicated by the arrows), after the first growth stage or coalescing step.

Step F—A third growth stage "OVER" is performed, wherein the non-polar or semi-polar III-Nitride material (12) grows laterally over the patterned mask (3) (as indicated by the arrows) to form an overgrown non-polar or semi-polar III-Nitride material. This growth may continue until the overgrown material (12) forms a fully coalesced continuous film, or even if it remains an uncoalesced overgrowth.

The result of the method of FIG. 3 is a device, or a free standing wafer, or a substrate, or a reduced defect density template, fabricated using the method.

Note that the template material (1) may have a thickness comparable or scaled relative to dimensions of the openings (4) in the patterned mask (3), in order to compensate for competing lateral to vertical growth rates. In this regard, the dimensions are the width of the openings (4), or the dimensions along the lateral direction in which the tops (8) of the sidewalls (7) are coalescing.

For example, to compensate, the template material (1) thickness is chosen with respect to the width dimension of the openings (4), which will form a trench (5) after etching, having a separation such that the tops (9) of the sidewalls (7) coalesce before growth from the bottoms (9) of the trenches (5) reach the tops (8) of the sidewalls (7).

This means that, if the lateral and vertical growth rates are comparable, then the dimensions of the openings (4) should be less than the thickness of the template material (1). Alternatively, if the lateral growth rate is faster than the vertical growth rate, then the dimensions of the openings (4) can be larger than the thickness of the template material (1).

Similarly, the etching may be to one or more etch depths comparable or scaled relative to the dimensions of the openings (4), in order for the tops (8) of the sidewalls (7) to coalesce before the defected non-polar or semi-polar III-Nitride material growing from the bottoms (8) of the trenches (5) reaches the tops (8) of the sidewalls (7).

Further, growth from the bottoms (9) of the trenches (5) may be prevented by etching to the substrate (2), or by depositing an additional mask (3) on the bottoms (9) of the trenches (5). At least Steps A and C may comprise growth using a lateral overgrowth technique.

To control a lateral and vertical growth rate during the first (D), second (E) or third (F) growth stages illustrated in FIG. 3, growth conditions for non-polar a-{11-20} plane gallium nitride films are specified by: a temperature in a range of 1000-1250° C., a reactor pressure in a range of 20-760 Torr, and a V/III ratio in a range of 100-3500, wherein during at least one of the first, second or third growth stages the conditions are such that the lateral growth rate is greater than the vertical growth rate. These conditions may vary from reactor to reactor and also from one growth method to another.

By employing the present invention, the dislocation density is reduced by eliminating or reducing defects in the overgrown non-polar or semi-polar III-Nitride material over the mask (3) and coalesced openings (4) (window) regions. In this regard, dislocation densities may be reduced at least one order of magnitude lower than that achieved in non-polar or semi-polar III-Nitride material using conventional single step LEO.

Also, with proper growth conditions, the present invention decreases stacking fault densities with an anisotropy factor, by encouraging higher growth rates on a gallium (Ga) face of the non-polar III-Nitride material and limiting growth rates on a nitrogen (N) face of the non-polar III-Nitride material, thereby reducing stacking fault densities at least one order of magnitude lower than that achieved in non-polar nitride material or achieved using conventional single-step LEO, and confining stacking faults to the N faces.

Finally, the present invention may be performed using any epitaxial material that can be grown using a lateral overgrowth technique. Thus, the epitaxial material may comprise, but is not limited to, non-polar or semi-polar III-Nitride material such as non-polar {11-20} or {1-100} plane GaN or semi-polar {10-1n} plane GaN. Thus, the template material may comprise any material from which nucleation and growth of the epitaxial material is achievable.

Experimental Results

As an example, 3 μm thick non-polar a-plane or m-plane GaN film is deposited on an r-plane $Al_2O_3$ substrate using a low-temperature GaN nucleation layer by MOCVD to form a template. Alternatively, the film could be deposited on m-plane SiC using an AlN nucleation layer. A 1 μm thick $SiO_2$ film is deposited on this template by plasma-enhanced chemical vapor deposition (PECVD). Conventional photo-lithography is used to pattern a photoresist mask layer comprised of 8 μm-wide stripes separated by 2 μm-wide openings. The stripe orientation is chosen as <1-100> for a-GaN and as <11-20> for m-GaN. The GaN template thickness is chosen with respect to the width of the mask window, which will form a trench with a separation such that the tops of the GaN sidewalls coalesce before the bottoms of the trenches reach the top. The patterned mask is then dry etched using inductively coupled plasma (ICP) etching to get vertical $SiO_2$ sidewalls, completely etching the exposed $SiO_2$ away. The remaining photoresist is removed with stripper, and subsequently the samples are cleaned with solvent. 3 μm thick non-polar GaN exposed through the $SiO_2$ openings is etched more than 2 μm down by using reactive ion etching (RIE). The sample is treated with a final solvent clean before regrowth. The wafer, which now consists of an etched non-polar GaN template that is patterned with 8 μm-wide $SiO_2$ stripes separated by 2 μm-wide openings, is loaded into the MOCVD reactor for regrowth. During this specific regrowth, relatively high growth temperatures are used at low pressures and various V/III ratios to enhance lateral growth. The V/III ratio is changed to control the lateral and vertical growth rates comparably at different stages of growth. During the growth process, GaN nucleates on the GaN sidewalls and exposed GaN material (or $Al_2O_3$ or SiC) at the bottom of the trenches, and coalesces from the tops of the etched GaN sidewalls, and grows out through the mask openings up and over the $SiO_2$ mask. The film then grows laterally over the $SiO_2$ mask, eventually coalescing with neighboring GaN stripes.

Figure 4A:
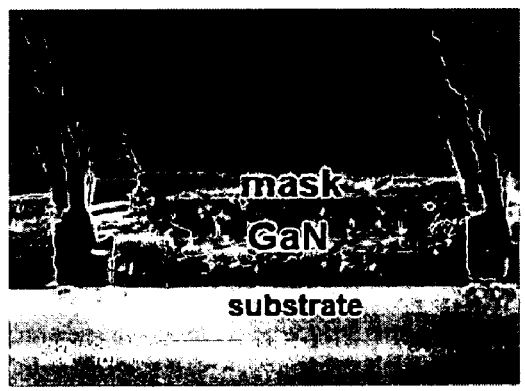
FIG. 4(a) is a scanning electron microscopy image of SLEO material grown by MOCVD in the first growth stage.
Figure 4B:
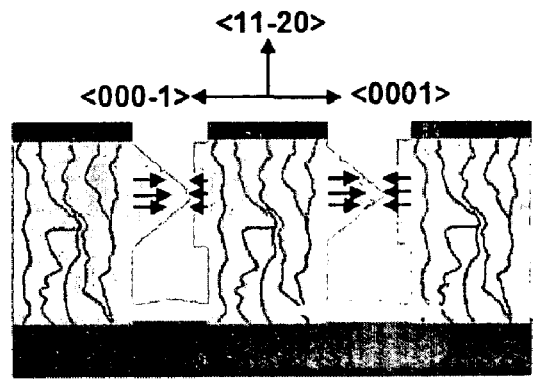
FIG. 4(b) is a schematic that illustrates the first stage of sidewall growth from the tops of the GaN pillar sides which blocks growth from the trench bottoms.

FIG. 4(a) is a scanning electron microscopy image of SLEO material grown by MOCVD in the first growth stage, and FIG. 4(b) is a schematic that illustrates the first stage of sidewall growth from the tops of the GaN pillar sides which blocks growth from the trench bottoms.

An example of a coalesced a-plane GaN film grown by SLEO with MOCVD is shown in FIGS. 5(a) and 5(b) in a cross-section view, wherein FIG. 5(a) is a scanning electron microscopy image of a coalesced SLEO material and FIG. 5(b) is a schematic that further illustrates the coalesced SLEO material.

Regrowth in this example proceeds first by coalescing non-polar GaN laterally from the tops of the etched sidewalls (Step D—first growth stage), before the defective material growing from the trench bottom reaches the tops of the sidewalls, as described above. Then, the coalesced material grows up from the opening (Step E—second growth stage) and over the 8 μm-wide mask stripe (Step F—third growth stage), until adjacent stripes of non-polar material coalesce forming a continuous a-GaN film with low defect density. By utilizing sidewall growth, threading dislocations are blocked, so coalesced films have lower dislocation densities not only in the overgrown regions but also in the window regions. By utilizing higher Ga-face horizontal growth rates, the stacking fault density is reduced and limited only to areas of N-face overgrowth.

A completely coalesced film of such SLEO material was achieved using MOCVD, as shown in FIGS. 5(a) and 5(b). A stripe of non-polar GaN was grown through a 2 μm-wide opening (comprising a window) in a $SiO_2$ mask, which was patterned parallel to <1-100> to achieve planar sidewalls in subsequent lateral growth steps. The non-polar GaN was subsequently grown over the 8 μm-wide masked region defined by a mask stripe.

Possible Modifications and Variations

The preferred embodiment has described a LEO process from the etched sidewalls of a non-polar or semi-polar I II-Nitride template. Alternative appropriate substrate materials, on which the non-polar or semi-polar III-Nitride or GaN template could be formed include but are not limited to a- and m-plane SiC or r-plane $Al_2O_3$. The template material to use as a base for the sidewall growth process can be any non-polar or semi-polar III-Nitride template material including but not limited to GaN, AlN, AlGaN, and InGaN with various thicknesses and crystallographic orientations. This material can be formed by any means using MOCVD or HVPE or any other variety of methods. To grow such template material different nucleation layers including GaN and AlN can be used. A variety of mask materials, including dielectric, and geometries with various aperture or opening spacing, sizes and dimensions may be used. Mask deposition methods with different mask thicknesses, and mask patterning technique with various orientations may be used in practice of this invention without significantly altering the results. Many alternative etching methods, including but not limited to wet and dry etching techniques, can be used while etching the mask and/or the template material. The etch depth of the template material can be varied as long as the material growing laterally from the sidewalls coalesces and blocks the defective material growing vertically from the trench bottoms. Etching of the substrate can be included in the process to ensure growth only from the sidewalls. The one or more trenches formed by the etching may have a variety of shapes, comprising U shaped or V shaped grooves, holes or pits.

Another possible variation could be that after etching the III-Nitride material as described above, an additional mask may be deposited on the bottom of the trenches to allow regrowth from the sidewalls only.

The growth parameters required for the lateral overgrowth of non-polar or semi-polar III-Nitride from the sidewalls will vary from reactor to reactor. Such variations do not fundamentally alter the general practice of this invention. Although it is desirable, final coalescence of the film over the mask is not a requirement for the practice of this invention. Therefore, this disclosure applies to both coalesced and uncoalesced laterally overgrown non-polar or semi-polar III-Nitride films from sidewalls.

The invention described herein, and all its possible modifications, can be applied multiple times by repeating the SLEO process after achieving coalescence, one layer over another layer, thereby creating a multi-step SLEO process to decrease defect densities even further.

This invention can be practiced with any kind of growth method including but not limited to metalorganic chemical vapor deposition (MOCVD), and Hydride Vapor Phase Epitaxy (HVPE), and molecular beam epitaxy (MBE), or the combination of any of these growth methods at various stages of SLEO processing and growth.

Advantages and Improvements

The present invention is the first-ever successful execution of SLEO of non-polar GaN. It is now possible to reduce the presence of dislocations most effectively in the simplest possible way in non-polar or semi-polar III-Nitride materials, while preventing polarization effects in the resulting devices.

Figures 6A, 6B, 6C:
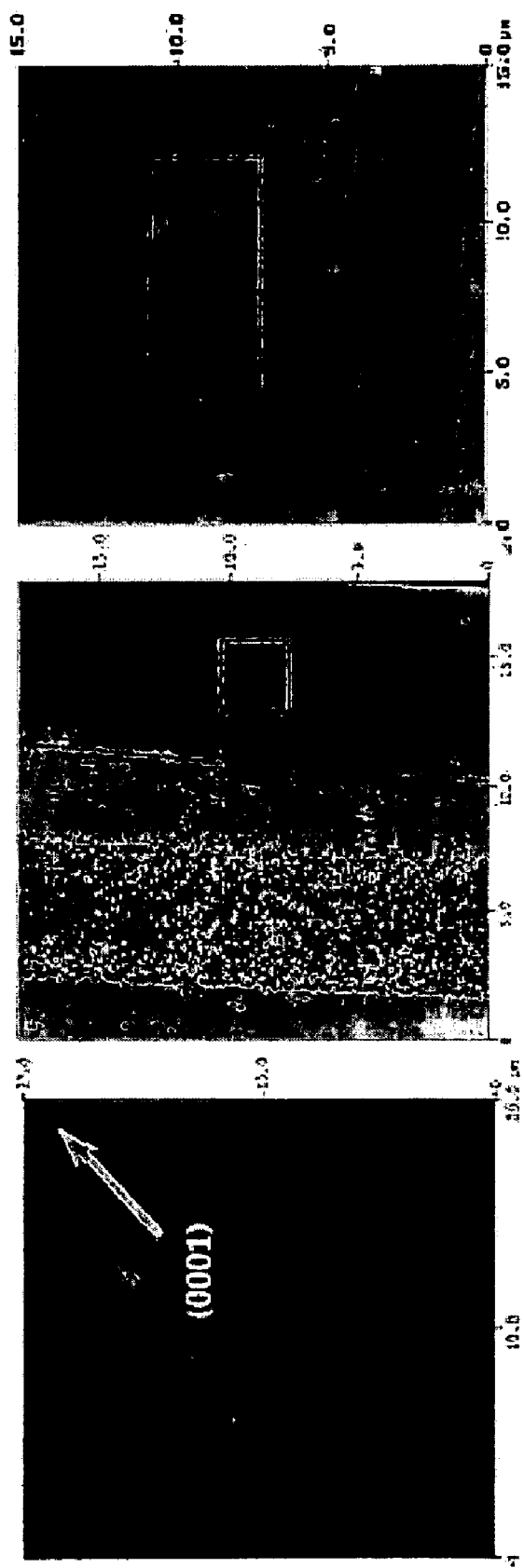
FIGS. 6(a), 6(b) and 6(c) are atomic force microscopy images, and x-ray diffraction Full Width Half Maximum values that illustrate the dramatic improvement in film quality by making side by side comparison of planar non-polar planar, single step LEO, and SLEO GaN.

As an example, FIGS. 6(a), 6(b) and 6(c) are atomic force microscopy images, and x-ray diffraction FWHM values that illustrate the dramatic improvement in film quality by making side by side comparison of planar non-polar planar, single-step LEO, and SLEO GaN. FIG. 6(a) shows planar a-GaN with an rms of ~6.0 nm with an on-axis FWHM of 0.29° (110) and an off-axis FWHM of 0.460 (101). FIG. 6(b) shows a single-step LEO a-GaN with an rms of ~5.822 (0.467) nm with an on-axis FWHM of 0.17° and an off-axis FWHM of 0.27°. FIG. 6(c) shows a SLEO a-GaN with an rms of ~0.620 (0.499) nm with an on-axis FWHM of 0.0820 and an off-axis FWHM of 0.114°.

Planar non-polar GaN films have been reported to have high threading dislocation densities of ~$10^{10}$ cm$^{-2}$ and stacking fault densities of $3.8 \times 10^5$ cm$^{-1}$ (perpendicular to c-axis, on N face). These values are reduced by one or two orders of magnitude by using single step lateral epitaxial growth by HVPE or MOCVD. Yet with the present invention, the density of these dislocations and stacking faults was reduced further down to ~$10^6$-$10^7$ cm$^{-2}$ and $10^3$-$10^4$ $^{cm-1}$, respectively.

Previous to this discovery, reduced defect density with a fully coalesced smooth non-polar GaN film was tried by means of single-step LEO and double-step LEO methods. But neither of these methods was successful in getting fully coalesced dislocation free, reproducible material in the most time and energy-efficient way. Even though double-step LEO was able to reduce the majority of defects, it required large amounts of time, energy, and resources. Conventional single-step LEO, even though it was simple (involving only one set of processing and growth steps), could not eliminate the majority of the defects.

The present discovery, combining the advantages of these two methods, allows significant defect reduction by leaving most areas defect-free while involving only one processing and growth step. In other words, this invention allows having double-step LEO results with single-step LEO efforts. Such effective defect reduction and elimination of polarization field at the same time will provide for breakthrough improvements in the electronic, optoelectronic, and electromechanical devices that are subsequently grown over this material.

A previous report similar to sidewall lateral overgrowth (SLEO) of GaN by MOCVD is known as pendeo-epitaxy. This technique has been demonstrated only for polar c-plane GaN growth. And, it also has fundamental differences in terms of processing and growth. For example, the substrate, relatively expensive SiC, is used as a "pseudo" mask, meaning that the growth takes place selectively only at the sidewalls and not on the substrate. As a result, the material has to be etched down to the substrate and also the etching process should be continued into the substrate until a certain depth. Consequently, the growth does not initiate through open windows. Therefore, there is no variable involved during growth to coalesce tops of the sidewalls through the open windows before the vertically grown material from the bottom of the trenches reaches the tops of the sidewalls. The lateral growth involves the nucleation on and growth from the whole etched sidewall. The main focus is the growth of the whole pillar.

Another similar study, lateral overgrowth from trenches (LOFT), suggested growing GaN from the trenches by only exposing the sidewalls after depositing SiO$_2$ mask to the top and the bottom of the pillars. This was demonstrated only for polar c-GaN.

Presently, GaN films must be grown heteroepitaxially due to the unavailability of bulk crystals, and no perfectly lattice-matched substrates exist for this growth process. As a result, the present invention also produces an excellent material base to grow free standing GaN substrate for eventual homoepitaxial growth.

REFERENCES

The following references are incorporated by reference herein:

1. Tsvetanka S. Zhelva, Scott A. Smith, et al., "Pendeo-Epitaxy—A new approach for lateral growth GaN structures," MRS Internet J. Nitride Semicond. Res. 4S 1, G3.38 (1999).
2. Y. Chen, R. Schneider, Y. Wang, "Dislocation reduction in GaN thin films via lateral overgrowth from trenches", Appl. Phys. Letters., 75 (14) 2062 (1999).
3. Kevin Linthicum, Thomas Gehrke, Darren Thomson, et al., "Pendeoepitaxy of gallium nitride films," Appl. Phys. Lett., 75 (2) 196 (1999).
4. M. D. Craven, S. H. Lim, F. Wu, J. S. Speck, and S. P. DenBaars, "Threading dislocation reduction via laterally overgrown nonpolar (11-20) a-plane GaN," Appl. Phys. Lett., 81 (7) 1201 (2002).
5. Changqing Chen, Jianping Zhang, Jinwei Yang, et al., "A new selective area lateral epitaxy approach for depositing a-plane GaN over r-plane sapphire," Jpn. J. Appl. Phys. Vol. 42 (2003) pp. L818-820.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, such as additional adjustments to the process described herein, without fundamentally deviating from the essence of the present invention. It is intended that the scope of the invention be limited not by this detailed description, but rather by the claims appended hereto.

What is claimed is:

1. A method of reducing threading dislocation densities in non-polar and semi-polar III-Nitride material, comprising:
    (a) performing a lateral epitaxial overgrowth of non-polar or semi-polar III-Nitride material from sidewalls of etched template material through a patterned mask.

2. The method of claim 1, wherein the material is any non-polar or semi-polar crystal orientation of III-Nitride material.

3. The method of claim 1, further comprising:
    (1) forming the patterned mask on the template material;
    (2) etching the template material through one or more openings in the patterned mask to form one or more trenches or pillars in the template material, wherein the trenches or pillars define the sidewalls; and
    (3) growing the non-polar or semi-polar III-Nitride material laterally from tops of the sidewalls and vertically from bottoms of the trenches, wherein the III-Nitride material growing laterally from the tops of the sidewalls coalesces before the III-Nitride material growing vertically from the bottoms of the trenches reaches the tops of the sidewalls.

4. The method of claim 3, wherein the non-polar or semi-polar III-Nitride material growing laterally from the tops of the sidewalls blocks the non-polar or semi-polar III-Nitride material growing vertically from the bottoms of the trenches.

5. The method of claim 3, wherein the openings are aligned to create planar sidewalls in subsequent lateral growth steps.

6. The method of claim 3, wherein the template material has a thickness comparable or scaled relative to the openings' dimensions to compensate for competing lateral to vertical growth rates.

7. The method of claim 6, wherein the etching is performed to one or more etch depths comparable or scaled to the openings' dimensions in order for the non-polar or semi-polar III-Nitride material growing from the tops of the sidewalls to coalesce before the non-polar or semi-polar III-Nitride material growing from the bottoms of the trenches reaches the tops of the sidewalls.

8. The method of claim 3, wherein the non-polar or semi-polar III-Nitride material grows vertically up through the openings after coalescence.

9. The method of claim 3, wherein the non-polar or semi-polar III-Nitride material grows through the openings after coalescence, and then grows laterally over the patterned mask to form an overgrown non-polar or semi-polar III-Nitride film.

10. The method of claim 9, wherein dislocation densities are reduced by eliminating or reducing defects in the overgrown non-polar or semi-polar III-Nitride material.

11. The method of claim 3, further comprising reducing dislocation densities at least one order of magnitude lower than that achieved in III-Nitride materials using conventional single step lateral epitaxial overgrowth.

12. The method of claim 3, wherein:
to control a lateral and vertical growth rate, growth conditions for a-{11-20} plane gallium nitride (GaN) films are specified by: a temperature in a range of 1000-1250° C., a reactor pressure in a range of 20-760 Torr, and a V/III ratio in a range of 100-3500 at different stages of the growth, wherein the growth conditions are such that the lateral growth rate is greater than the vertical growth rate.

13. The method of claim 3, wherein the non-polar or semi-polar III-Nitride material grows only from regions of exposed template material, but not on the patterned mask.

14. The method of claim 3; further comprising:
decreasing stacking fault densities with an anisotropy factor, by encouraging higher growth rates on a gallium (Ga) face of the non-polar III-Nitride material and limiting growth rates on a nitrogen (N) face of the non-polar III-Nitride material, thereby reducing stacking fault densities at least one order of magnitude lower than that achieved in Nitride material using conventional single step lateral epitaxial overgrowth, and confining stacking faults to N faces.

15. The method of claim 3, further comprising:
preventing growth from the bottoms of the trenches by etching to a substrate or depositing an additional mask on the bottoms of the trenches.

16. A device, wafer, substrate or template manufactured using the method of claim 1.

17. A method of reducing threading dislocation densities in epitaxially grown non-polar or semi-polar III-Nitride films, devices or substrates, comprising:
(a) performing a lateral epitaxial overgrowth of epitaxial material from sidewalls of etched template material through a patterned mask, comprising:
(1) forming the patterned mask on the template material;
(2) etching the template material through one or more openings in the patterned mask to form one or more trenches or pillars in the template material, the one or more trenches or pillars comprising the sidewalls, tops of the sidewalls and one or more bottoms; and
(3) growing and coalescing the epitaxial material laterally from the tops before epitaxial material vertically growing from the one or more bottoms reaches the tops;
(4) growing the epitaxial material vertically up through the one or more openings after the growing and coalescing step (3);
(5) growing the epitaxial material laterally over the patterned mask to form overgrown material which may form a continuous film, after the growing and coalescing step (3),
wherein the growth in steps (3) and (5) is performed using a lateral overgrowth technique.

18. The method of claim 1, wherein the non-polar or semi-polar Ill-Nitride material is non-polar a-{11-20}plane, non-polar m-{1-100}plane, or semi-polar {10-1n}plane III-Nitride material.

* * * * *